United States Patent [19]

Avanzino et al.

[11] Patent Number: 5,686,354
[45] Date of Patent: Nov. 11, 1997

[54] DUAL DAMASCENE WITH A PROTECTIVE MASK FOR VIA ETCHING

[75] Inventors: Steven Avanzino, Cupertino; Subhash Gupta, San Jose; Rich Klein, Mountain View; Scott D. Luning, Menlo Park; Ming-Ren Lin, Cupertino, all of Calif.

[73] Assignee: Advanced Micro Devices, Inc., Sunnyvale, Calif.

[21] Appl. No.: 478,324

[22] Filed: Jun. 7, 1995

[51] Int. Cl.⁶ .................................................... H01L 21/28
[52] U.S. Cl. .......................... 437/190; 437/192; 437/195; 437/203
[58] Field of Search ................... 156/644.1, 643.1, 156/657.1; 437/195, 190, 981, 947, 203, 228, 192

[56] References Cited

U.S. PATENT DOCUMENTS

| | | | |
|---|---|---|---|
| 4,801,350 | 1/1989 | Mattox et al. | 156/643.1 |
| 5,093,279 | 3/1992 | Andreshak et al. | 437/173 |
| 5,227,014 | 7/1993 | Crotti et al. | 156/644.1 |
| 5,262,354 | 11/1993 | Cote et al. | 437/195 |
| 5,294,296 | 3/1994 | Yoon et al. | 437/981 X |
| 5,371,047 | 12/1994 | Greco et al. | 437/238 |
| 5,444,021 | 8/1995 | Chung et al. | 437/195 |

FOREIGN PATENT DOCUMENTS

| | | | |
|---|---|---|---|
| 4324638 | 2/1994 | Germany | H01L 21/283 |
| 86715 | 4/1987 | Japan. | |

*Primary Examiner*—Thi Dang
*Attorney, Agent, or Firm*—Foley & Lardner

[57] ABSTRACT

A dual damascene method of fabricating an interconnection level of conductive lines and connecting vias separated by insulation for integrated circuits and substrate carriers for semiconductor devices using a thin protective via mask to form the via openings. A conductive line mask pattern is used to form conductive line openings in an insulating layer. Next, a thin protective layer of conformal material is deposited in the conducive line opening. The protective layer and the insulating layer each have etch resistance to others etchant. Using a via mask pattern, openings are etching the protective layer with the insulating layer serving as and etch stop. Next via openings are etched in the insulating material using the openings in the thin protective layer as the etch mask. If the protective layer is a conductive material, it is removed from the surface of the insulating layer either before or after the conductive line and via openings are filled with a conductive material. If the protective material is an insulating material, it is entirely removed before filling the conductive line and via openings conductive material.

11 Claims, 3 Drawing Sheets

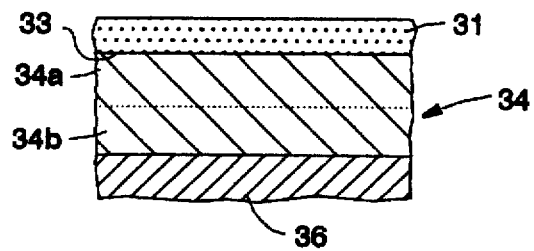
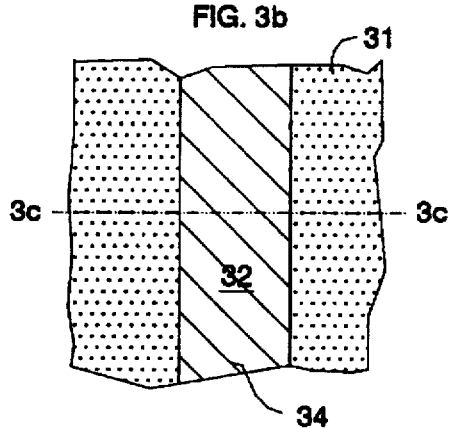
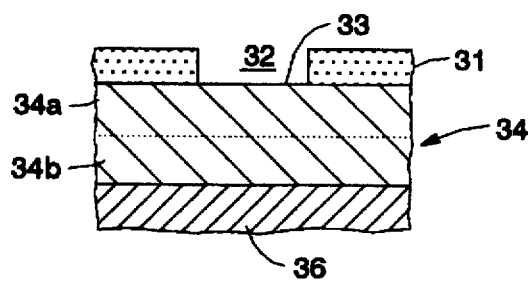
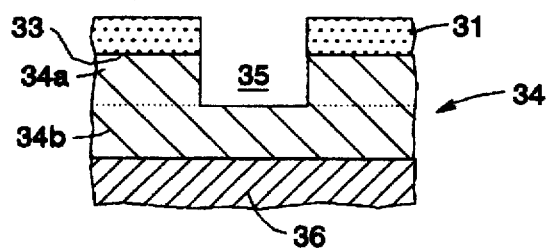
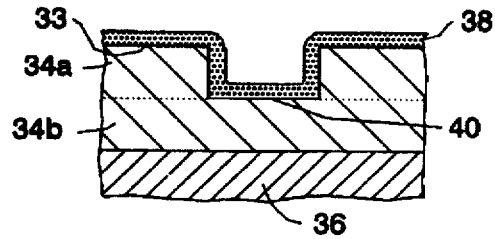

DUAL DAMASCENE WITH A PROTECTIVE MASK FOR VIA ETCHING

CROSS REFERENCES TO RELATED APPLICATIONS

This application is related to U.S. patent application Ser. No. 08/478,319, entitled SELF ALIGNED VIA DUAL DAMASCENE, filed on an even date herewith, now U.S. Pat. No. 5,614,765; U.S. patent application Ser. No. 08/478, 321, entitled SUBTRACTIVE DUAL DAMASCENE, also filed on an even date herewith; and U.S. patent application Ser. No. 08/486,777, entitled DUAL DAMASCENE WITHIN A SACRIFICIAL VIA FILL, also filed on an even date herewith.

BACKGROUND OF THE INVENTION

The present invention generally relates to the fabrication of metal conductive lines and vias that provide the interconnection of integrated circuits in semiconductor devices and/or the interconnection in a multilayer substrate on which semiconductor device(s) are mounted and, more particularly, to the fabrication of conductive lines and vias by a process known as damascene.

In very and ultra large scale integration (VLSI and ULSI) circuits, an insulating or dielectric material, such as silicon oxide, of the semiconductor device in the dual damascene process is patterned with several thousand openings for the conductive lines and vias which are filled with metal, such as aluminum, and serve to interconnect the active and/or passive elements of the integrated circuit. The dual damascene process also is used for forming the multilevel signal lines of metal, such as copper, in the insulating layers, such as polyimide, of multilayer substrate on which semiconductor devices are mounted.

Damascene is an interconnection fabrication process in which grooves are formed in an insulating layer and filled with metal to form the conductive lines. Dual damascene is a multi-level interconnection process in which, in addition to forming the grooves of single damascene, the conductive via openings also are formed. In the standard dual damascene process, the insulating layer is coated with a resist material which is exposed to a first mask with the image pattern of the via openings and the pattern is anisotropic etched in the upper half of the insulating layer. After removal of the patterned resist material, the insulating layer is coated with a resist material which is exposed to a second mask with the image pattern of the conductive lines in alignment with the via openings. In anisotropically etching the openings for the conductive lines in the upper half of the insulating material, the via openings already present in the upper half are simultaneously etched in the lower half of the insulating material. After the etching is complete, both the vias and grooves are filled with metal. Dual damascene is an improvement over single damascene because it permits the filling of both the conductive grooves and vias with metal at the same time, thereby eliminating process steps. Although this standard damascene offers advantages over other processes for forming interconnections, it has a number of disadvantages, such as the edges of the via openings in the lower half of the insulating layer are poorly defined because of the two etchings and the via edges being unprotected during the second etching. Thus, improvements are needed in the standard damascene process to eliminate the poor edge definition of the via openings.

SUMMARY OF THE INVENTION

The primary object of the present invention is to provide an improved dual damascene process for forming the conductive lines and conducive vias with two etchings but with sharply defined edges on the via opening.

In accordance with the present invention, the order of the mask patterns for the conductive via opening and the conductive line opening are reversed from the standard dual damascene process, with a conductive line opening being formed first followed by the formation of a conductive via opening. After the formation of the conductive line opening and prior to the formation of the conductive via opening. A thin conformal etch barrier layer with an etch selectivity different from the insulating material is deposited on surface of the insulating layer and on the walls and bottom of the conductive line opening. With the insulating layer serving as an etch stop, a via opening pattern is etched in the barrier layer. Then, using an etchant for the insulating layer, the via opening pattern is etched in the insulating layer with the barrier layer protecting the insulating layer in areas other than the opening. A more precisely defined via opening is obtained when etching through the thin etch mask layer of the barrier layer. After the via opening is formed, both the via and conductive line openings are filled with a conductive material.

BRIEF DESCRIPTION OF THE DRAWINGS

The foregoing and other objects, aspects and advantages will be better understood from the following detailed description of the preferred and other embodiments of the present invention with reference to the drawings, in which:

FIG. 1b (Prior Art) is a cross-sectional view of the patterned resist and etched insulating layer of FIG. 1a taken across 1b—1b of FIG. 1a.

FIG. 3a is a cross-sectional view of a portion of a resist layer on the insulating layer of the present invention.

FIG. 3b is a plan view of a portion of an exposed and developed conductive line resist pattern on the insulating layer of the present invention.

FIG. 3c is a cross-sectional view of the resist pattern on the insulating layer of FIG. 3b taken across 3c—3c of FIG. 3b.

FIG. 3d is a cross-sectional view of the resist patterned insulating layer of FIG. 3c etched half way through.

FIG. 3e is a cross-sectional view of the etched insulating layer of FIG. 3d with the resist removed and a conformal etch barrier layer on the upper surface of the insulating layer and on the walls and bottom of the opening in the insulating layer.

DETAILED DESCRIPTION OF THE PREFERRED EMBODIMENTS OF THE INVENTION

Figure 1A:
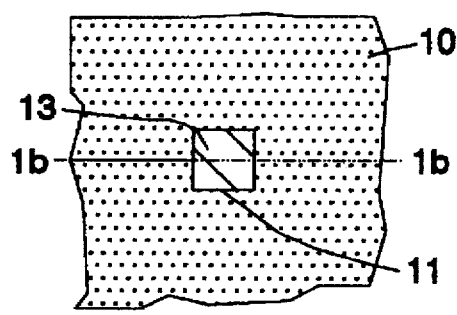
FIG. 1a (Prior Art) is a plan view of a portion of an exposed and developed via resist pattern on an etched insulating layer used in the standard dual damascene process.
Figure 1B:
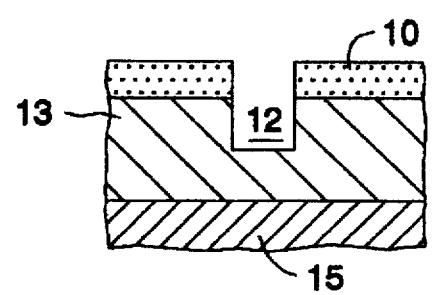
Figure 2A:
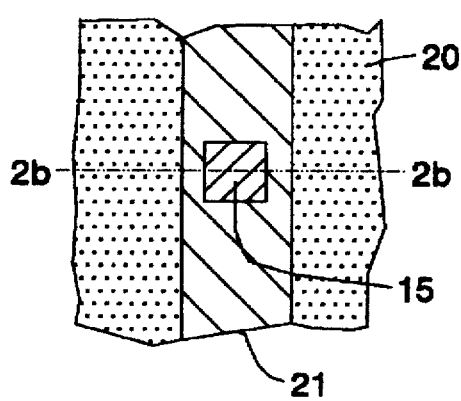
FIG. 2a (Prior Art) is a plan view of a portion of an exposed and developed conductive line resist pattern on the etched insulating layer used in the standard dual damascene process.
Figure 2B:
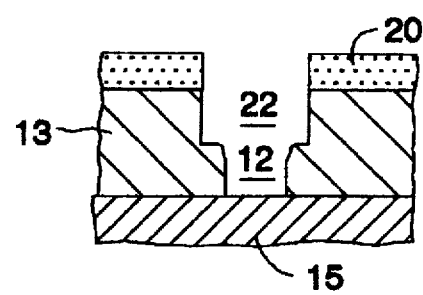
FIG. 2b (Prior Art) is a cross-sectional view of the patterned resist and etched insulating layer of FIG. 2a taken across 2b—2b of FIG. 2a and etched.
Figure 2C:
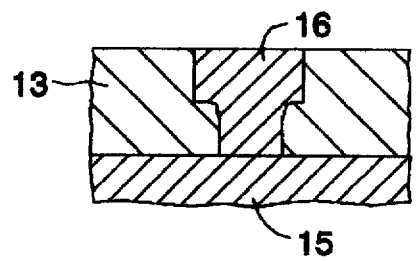
FIG. 2c (Prior Art) is a cross-sectional view of the opening in the insulating layer filled with metal.

Referring now to the drawings and, more particularly to FIGS 1*a* and 1*b* and FIGS. 2*a*, 2*b* and 2*c*, there is illustrated the standard method for forming dual damascene openings for conductive lines and vias. FIG. 1*a* shows a portion of a positive resist 10 with one via pattern opening 11 which is used to define a via opening 12 in an insulating layer 13 for etching the via opening in the insulating layer. As shown in FIG. 1*b*, the via opening 12 is etched in the upper portion of the insulating layer corresponding to pattern opening 11. The insulating layer is disposed on a completed metallized insulating layer (not shown) containing a conductive line 15 to be physically contacted and electrically connected to an upper conductive line and via, when formed. After the via opening 12 is formed, a resist layer 20 containing a conductive line pattern 21, as shown in FIG. 2*a*, is aligned with the via opening 12. The conductive line pattern 21, which is wider than the via opening 12, is anisotropically etched in the upper portion of the insulating layer to form the conductive opening 22. Simultaneously with this etching, the via opening 12, which is exposed to the same etchant gas(es), is etched (and replicated) in the lower portion of insulating layer 13 to the underlying conductive line 15 which serves as an etch stop. Next, the openings 12, 22 for the conductive line and conductive via, respectively, are filled with metal 16 to make physical contact with and electrical connection to the conductive line 15 as shown in FIG. 2*c*.

Although the standard dual damascene method provides advantages over other metallization methods, the two etching steps of vias causes the corners of the vias to become extremely ragged because they are covered with a thick resist during the first etch and are totally unprotected during the second etch.

Figure 3F:
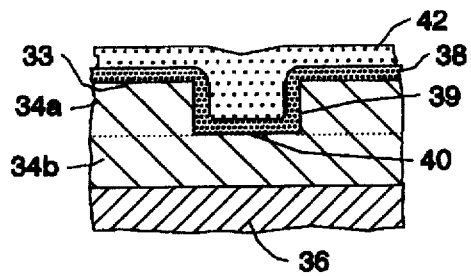
FIG. 3f is a cross-sectional view of the insulating layer with the conformal etch barrier layer of FIG. 3d and coated with a resist layer.

These disadvantages are overcome by the method of the present invention as generally shown in FIGS. 3*a* through 3*l*. As illustrated in these Figures a portion of an interconnection structure 30 is shown coated with a layer 31 of commercially available resist in FIG. 3*a* and with a conductive line pattern 32 as shown in FIGS. 3*b* and 3*c*. The resist layer 31 is coated on the surface 33 of an insulating layer 34, which is unitary layer of material of herein silicon dioxide ($SiO_2$) with a thickness of about 1.6 to 2.0 microns. For the purpose of describing the positions of the conductive line and the conductive via, the insulating layer 34 will be illustrated as having an upper portion 34*a* and a lower portion 34*b* as shown in the cross sectioned FIGS. 3 through 3*l*. The resist is a positive resist and the undeveloped resist 31 serves as an etch mask for etching a conductive line opening 35 (FIG. 3*d*) in the uncovered surface 33 of the insulating layer. The conductive line opening and a subsequent via opening, when filled with a conductive material, will provide an interconnection to a conductive line 36 in an underlying insulating layer (not shown). As illustrated in FIG. 3*d*, the insulating layer at the uncovered surface 33 is anisotropically etched with a plasma gas(es), herein carbon tetrafloride ($CF_4$), in a commercially available etcher, such as a parallel plate reactive ion etch (RIE) apparatus or, alternatively, an electron cyclotron resonance (ECR) plasma reactor to replicate the mask pattern in the upper portion 34*a* and thereby create the conductive line opening 35 in the layer 34. The resist 31 serves as a etch barrier during etching, which is timed for a predetermined depth, which herein is half way through the $SiO_2$ or 0.4 to 0.5 microns. The use of a positive resist is not critical and a negative resist can be used, with the mask pattern being reversed. After the resist 31 is removed by a conventional technique such as ashing in an oxygen ($O_2$) plasma, a thin conformal etch barrier layer 38 of titanium nitride (TIN), silicon nitride ($Si_3N_4$, SiN) or silicon oxynitride ($SiO_xN_y$), herein about 1000 Å of (TIN), is deposited on the surface 33 of the insulating layer and the walls 39 and bottom 40 of the conductive line opening 35 as shown in FIG. 3*e*. The etch properties of the etch barrier 38 are such that it is or exhibits high selectivity to the etchant, herein $CF_4$ containing fluorine atoms for the $SiO_2$.

Figure 3G:
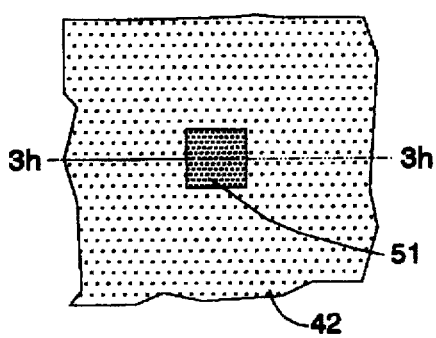
FIG. 3g is a plan view of the insulating layer of FIG. 3f with the barrier layer and with the resist layer exposed and developed to a via pattern.
Figure 3H:
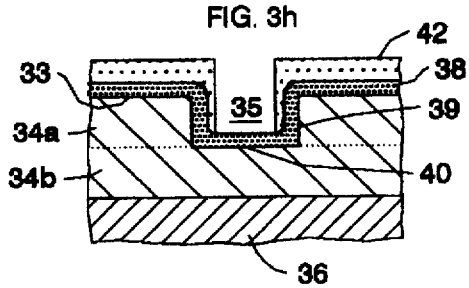
FIG. 3*h* is a cross-sectional view of the insulating layer taken across 3*h*—3*h* of FIG. 3*g*.
Figure 3I:
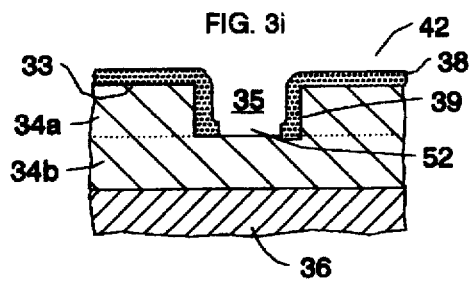
FIG. 3*i* is a cross-sectional view of the insulating layer and the conformal etch barrier layer of FIG. 3*h* with the barrier layer etched to the via pattern and the resist layer removed.
Figure 3J:
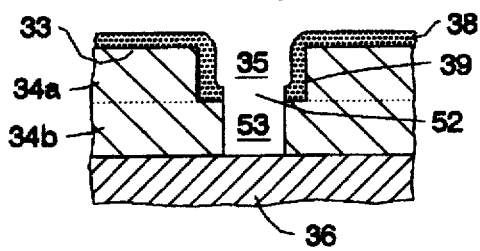
FIGS. 3*j*, 3*k* and 3*l* are cross-sectional views of the insulating layer with the etched barrier layer in sequential steps of etching the via pattern opening in the insulating layer, filling the opening with metal and planarizing the metal surface layer.
Figure 3K:
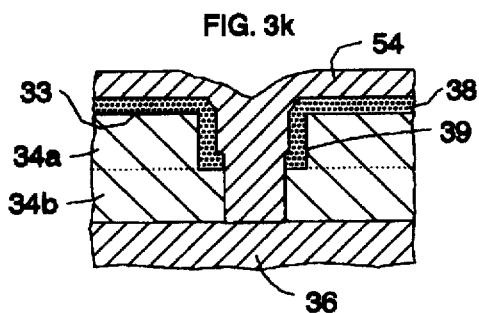
Figure 3L:
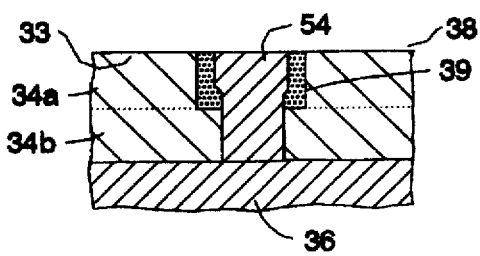

As shown in FIG. 3*f*, a second coating of positive resist 42 is applied as a thick layer on the etch barrier layer. A via pattern 51 is formed in resist layer 42 in alignment with the conductive line opening 35, as shown in FIGS. 3*g* and 3*h*. The undeveloped resist 42 serves as an etch mask for anisotropically etching an opening 52 in the etch barrier 38 of herein TiN with $CF_4$, which etches TiN about 10 times slower than $SiO_2$ and, although etchable by $CF_4$ can still serve as an etch stop when etching $SiO_2$. The resist 42 could remain during the etching of the via opening, but is removed, in accordance of one aspect of the present invention, because a thin mask, such as the 1000 Å TiN etch barrier layer 38, in contrast to a thick resist mask, provides more precise edges for etching a via opening 53. After removing the resist as shown in FIG. 3*i*, the edges of etch barrier layer then provide a thin mask through its opening 52 for etching the lower portion 34*b* of the insulating layer 34 as shown in FIG. 3. The barrier layer 38 remains in the openings in filling the conductive line and via openings 35, 53, respectively, with a conductive material 54 such an aluminum (Al) or an alloy of aluminum. Because TiN has a lower resistivity than the other barrier material, it is the preferred barrier material as the etch barrier 38. Herein, the conductive line and via openings are filled with Al which is doped with about 1% copper (Cu), as shown in FIG. 3*k*, and planarized to the surface 33 of the insulating layer 34 to remove the excess conductive material 54 and the barrier layer 38 on the surface, as shown in FIG. 3*l*.

Although this invention has been described relative to specific insulating materials, conductive materials and apparatus for depositing and etching these materials, it is not limited to such materials and other materials and apparatuses for depositing the etching insulating and conductive materials can be substituted as is well understood by those skilled in the microelectronics multilayer interconnection arts. Further, although the embodiments of the present invention is directed to dual damascene on semiconductor devices, it also will be recognized by those skilled in multilayer interconnection substrates arts that the present invention can be used in fabricating those substrates packages to interconnect one or more semiconductor devices (chips) in a higher level electronic system. Such multilevel or multilayer substrates uses organic insulating layers, such as polyimide, and conductive lines, such as copper. The dual damascene process of the present invention with a protective mask for via etching is well suited for the manufacture of such multilevel insulating and conductive layers with connecting conductive vias.

We claim:

1. A method of fabricating interconnecting conductive lines and conductive vias in a layer of insulating material of a sufficient thickness to contain both the conductive lines and vias comprising the steps of:

forming a conductive line opening with sidewalls and a bottom in a layer of insulating material having a thickness from its upper surface to partially through said thickness, said thickness being thickness of the conductive line being formed;

covering the upper surface of the insulating layer and the sidewalls and the bottom of the conductive line opening with a layer of thin conformal etch barrier material;

forming a via opening in said barrier layer at the bottom of the conductive line opening, in alignment with the line opening, and without removing any of the barrier layer on the sidewalls;

etching a via opening in the remaining portion of the thickness of said insulating material by using said via opening in said barrier layer as an etch mask for said etching; and filling said conductive line opening and said via opening with a conductive material without removing the etch barrier.

2. The method of claim 1 wherein the conformal etch barrier layer is conductive.

3. The method of claim 1 wherein etch barrier has high selectivity to the plasma etchant used in etching the via opening in the insulating material.

4. The method of claim 3 wherein the etch barrier etches about ten times slower than the insulating material when etched with the plasma etchant used to etch the insulating material.

5. The method of claim 1 wherein the insulating material is an oxide of silicon and the plasma etchant contains fluorine atoms and ions.

6. The method of claim 5 wherein the oxide of silicon material is silicon dioxide.

7. The method of claim 1 wherein the etch barrier layer is conductive and is removed from the upper surface of the insulating layer after the conductive line opening and via opening are filled with a conductive material.

8. A method of fabricating interconnecting conductive lines and conductive vias in a layer of insulating material comprising the steps of:

forming a conductive line opening with sidewalls and a bottom in a layer of insulating material and having a thickness from its upper surface to partially through said thickness, said thickness being the thickness of the conductive line to be formed;

covering the surface of the insulating material and the sidewalls and the bottom of the conductive line opening with a layer of a thin conformal etch barrier material of titanium nitrite;

forming a via opening in said barrier layer at the bottom of the conductive line opening and in alignment with the line opening;

etching a via opening in the remaining portion of the thickness of said insulating layer by using said via opening in the barrier layer as an etch mask for said etching; and filling said conductive line opening and said via opening with a conductive material without removing the etch barrier.

9. The method of claim 8 wherein the conductive material is either aluminum or an alloy of aluminum.

10. The method of claim 9 wherein the titanium nitride is about 1000 Å thick.

11. A method of fabricating interconnecting conductive lines and conductive vias in a layer of insulating material having an upper portion and a lower portion and of a thickness to contain both the conductive lines and vias comprising the steps of:

forming a conductive line openings with sidewalls and a bottom in an upper portion of a layer of insulating material and having an upper surface, the depth of the insulating layer from the upper surface being about the thickness of the conductive line to be formed;

covering the surface of the insulating layer and the sidewalls and the bottom of the conductive line opening with a layer of thin conformal etch barrier material;

forming a via opening in said barrier layer at the bottom of the conductive line opening, in alignment with the line opening, and without removing any of the barrier layer on the sidewalls;

etching a via opening in the lower portion of the layer of insulating material by using said via opening in said barrier layer as an etch mask for said etching; and filling said conductive line opening and said via opening with a conductive material without removing the etch barrier.

* * * * *